US009197368B2

(12) United States Patent
Ghiasi et al.

(10) Patent No.: US 9,197,368 B2
(45) Date of Patent: Nov. 24, 2015

(54) INBAND MANAGEMENT OF ETHERNET LINKS

(71) Applicant: Broadcom Corporation, Irvine, CA (US)

(72) Inventors: Ali Ghiasi, Cupertino, CA (US); Velu Chellam Pillai, Austin, TX (US)

(73) Assignee: BROADCOM CORPORATION, Irvine, CA (US)

( * ) Notice: Subject to any disclaimer, the term of this patent is extended or adjusted under 35 U.S.C. 154(b) by 106 days.

(21) Appl. No.: 14/062,171

(22) Filed: Oct. 24, 2013

(65) Prior Publication Data

US 2015/0089319 A1 Mar. 26, 2015

Related U.S. Application Data

(60) Provisional application No. 61/881,673, filed on Sep. 24, 2013.

(51) Int. Cl.
*H03M 13/05* (2006.01)
*H04L 1/00* (2006.01)
*H03M 13/09* (2006.01)
*H03M 13/53* (2006.01)

(52) U.S. Cl.
CPC .......... *H04L 1/0063* (2013.01); *H03M 13/098* (2013.01)

(58) Field of Classification Search
CPC .. H03M 13/09; H03M 13/098; H04L 1/0061; H04L 1/0057; H04L 43/50; H04L 12/2697; H04L 1/0063; G06F 11/10; G06F 11/1076
See application file for complete search history.

(56) References Cited

U.S. PATENT DOCUMENTS

| | | | | |
|---|---|---|---|---|
| 6,493,342 | B1 * | 12/2002 | Breslow et al. | 370/394 |
| 6,711,704 | B1 * | 3/2004 | Tezuka | 714/712 |
| 6,876,315 | B1 * | 4/2005 | Widmer | 341/58 |
| 8,514,634 | B1 * | 8/2013 | Wu | 365/189.011 |
| 2004/0135710 | A1 * | 7/2004 | Widmer | 341/59 |
| 2012/0102210 | A1 * | 4/2012 | Kudo | 709/228 |
| 2013/0251012 | A1 * | 9/2013 | Fujimori | 375/224 |

OTHER PUBLICATIONS

Roy Bynum, Recommendations for Operational Maintenance Functions Within the 10GbE WAN Compatible PHY, May 2000, MCI Broadcom, P802.3ae, Interim Meeting.*

* cited by examiner

*Primary Examiner* — April Y Blair
*Assistant Examiner* — Dipakkumar Gandhi
(74) *Attorney, Agent, or Firm* — Oblon, McClelland, Maier & Neustadt, L.L.P.

(57) ABSTRACT

Disclosed are various embodiments for in-band management of Ethernet links utilizing a bit-interleaved parity (BIP) block in a transmission frame. According to various embodiments, a bit-interleaved parity error code may be generated for a monitored portion of network data for transmission in a first bit-interleaved parity block. Subsequently, network management data may be encoded in a plurality of bits for transmission in a second bit-interleaved parity block according to a predefined block code, wherein the predefined block code generates the plurality of bits to maintain a DC balance between the bit-interleaved parity error code and the plurality of bits.

20 Claims, 7 Drawing Sheets

Bit Position:

0 1 2 9 10 17 18 25 26 33 34 41 42 49 50 57 58 65

| 10 | $M_0$ | $M_1$ | $M_2$ | $BIP_3$ | $M_4$ | $M_5$ | $M_6$ | $BIP_7$ |
|---|---|---|---|---|---|---|---|---|

303 306 312 309 315

300

INBAND MANAGEMENT OF ETHERNET LINKS

CROSS-REFERENCE TO RELATED APPLICATIONS

This application claims the benefit of and priority to U.S. Provisional Application Ser. No. 61/881,673, filed Sep. 24, 2013, and entitled "INBAND MANAGEMENT OF ETHERNET LINKS" which is incorporated by reference herein in its entirety.

BACKGROUND

In-band management relates to the local management of a network. In-band management may be achieved, for example, via a virtual connection to a communication device in the network or by employing a Simple Network Management Protocol (SNMP). These connections consume bandwidth and traditionally require a complex management layer. In addition, management of a remote device in a network generally requires a processor sub-system with a dedicated Ethernet port which is often complex and costly.

Bit-interleaved parity (BIP) is a method of error detection employed in networks to determine whether a data transmission comprises an error. In BIP, a parity byte is calculated bit-wise across a number of bytes in a frame for data transmission, such as an Ethernet frame or data packet, to force character bit patterns into even parity.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Figure 1:
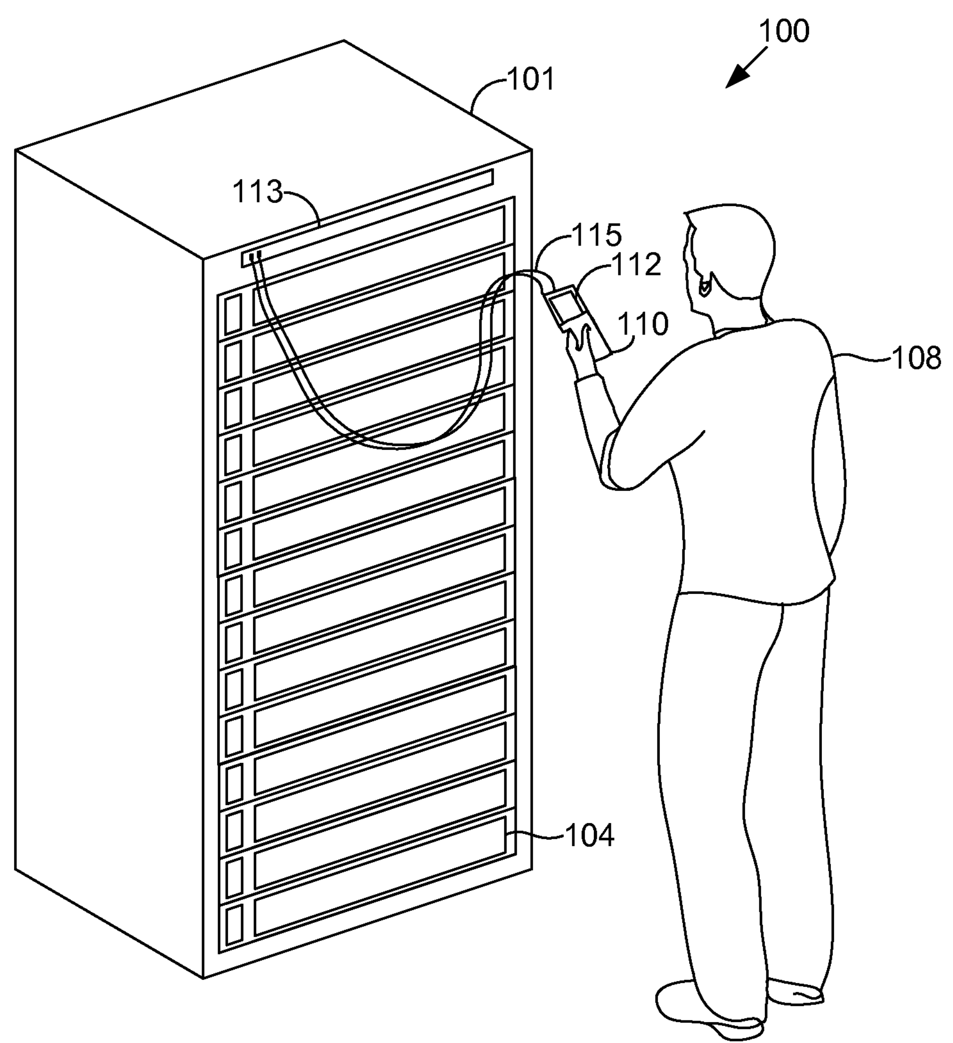
FIG. 1 is a drawing illustrating a network center environment in which network administrators control communication devices according to various embodiments of the present disclosure.

The present disclosure relates to in-band management of Ethernet links utilizing a bit-interleaved parity (BIP) block in a transmission frame. In-band management relates to the local management of a network. In-band management may be achieved, for example, via a virtual connection to a communication device within the network or by employing a Simple Network Management Protocol (SNMP). These connections consume bandwidth and traditionally require a complex management layer. Additionally, management of remote devices in a network generally requires a processor sub-system with a dedicated Ethernet port which is often complex and costly.

For example, an administrator of a network may monitor, maintain, or otherwise interact with communication devices (e.g., Ethernet switches, routers, servers) installed in one or more racks in a network center, wherein each of the one or more racks may be managed as an individual and segmented unit within the network center. A "top of the rack" (TOR) device (e.g., a server, a switch, etc.) located in a rack may connect to one or more Ethernet switches installed within the rack and may be used as a central device for monitoring or configuring the devices installed within the rack. Similarly, an "end of row" (EOR) device (e.g., a server, a switch, etc.) located in a rack may connect to one or more Ethernet switches installed within one or more racks in the network center and may be used as a central device for monitoring or configuring the devices within the one or more racks. To monitor, maintain, or otherwise interact with the Ethernet switches in the rack, the administrator may make a physically connection to the TOR device or EOR device via an Ethernet management cable and/or a console to transmit network management information used in the maintenance, configuration, reconfiguration, and/or management of the network.

According to various embodiments of the present disclosure, network management information may be encoded in existing transmission frames that otherwise would have been sent without network management information. A BIP error code may be generated for a monitored portion of network data for transmission in a first BIP block. Network management data may be encoded in a plurality of bits for transmission in a second BIP block according to a predefined block code, wherein the predefined block code generates the plurality of bits to maintain a direct current (DC) balance between the bit-interleaved parity error code and the plurality of bits, as will be discussed in greater detail below.

By transmitting network management data in existing transmission frames, maintenance and/or control of TOR and/or EOR devices may be facilitated without the use of an Ethernet management cable or console and will not increase the bandwidth used in transmitting separate network management data. Alternative in-band management implementations may require a designated internet protocol (IP) address, may be complex, and may consume network bandwidth. In the following discussion, a general description of the system and its components is provided, followed by a discussion of the operation of the same.

FIG. 1 shows an example environment 100 in which a TOR or EOR device is managed or otherwise configured. The example environment 100 may comprise a network center, a data center, and/or any other physical installation in which multiple computer equipment, resources, assemblies, and/or components are received and installed on an ongoing basis. The example environment 100 may house multiple components or resources, such as, e.g., computers, communication devices, networking components, power supplies, cooling equipment, and/or so forth. The equipment may be housed in rows or grids of similar or identical equipment racks. The network center may be housed in a room, a building, a compound that includes multiple buildings, modular container unit or any other environment used for housing computing equipment.

An equipment rack 101 is an example of a component assembly or component housing that may be used in a network center. The equipment rack 101 may contain multiple individual components 104 and/or other sub-components. The components 104 may be interconnected and connected to the equipment rack 101 using various cables in order to support network connectivity, console connectivity, electrical power, and/or other services.

The network center may be staffed by one or more administrators 108, or other support personnel. Generally, to configured one or more components 104 of the equipment rack 101, the administrators 108 may use a console 110 to assist in performing various diagnostic, informational, and administrative tasks. The console 110 may be a general-purpose device, such as a laptop computer, personal digital assistant (PDA), tablet computer, slate computer, smartphone, or a non-portable computing device (for example, a workstation or purpose-built stationary appliance located near the data center loading dock) upon which applications may be executed. The console 110 may comprise a display 112, a printer, and/or other type of interface device for communicating with the administrator 108.

The console 110 may be capable of configured the various components 104 of the equipment rack 101 by interacting with a TOR device 103 (or an EOR device) via an Ethernet cable 115 or like component. FIG. 1 depicts a traditional scenario in which the administrator 108 is conducting management operations on one or more of the various components 104 of the equipment rack 101 by interacting with the TOR device 113 via a console 110, traditionally requiring the use of an Ethernet cable and the physical presence of the administrator 108. However, by encoding network management data in existing transmission frames, the use of an Ethernet cable and the physical presence of the administrator 108 may be avoided.

Figures 2, 3:
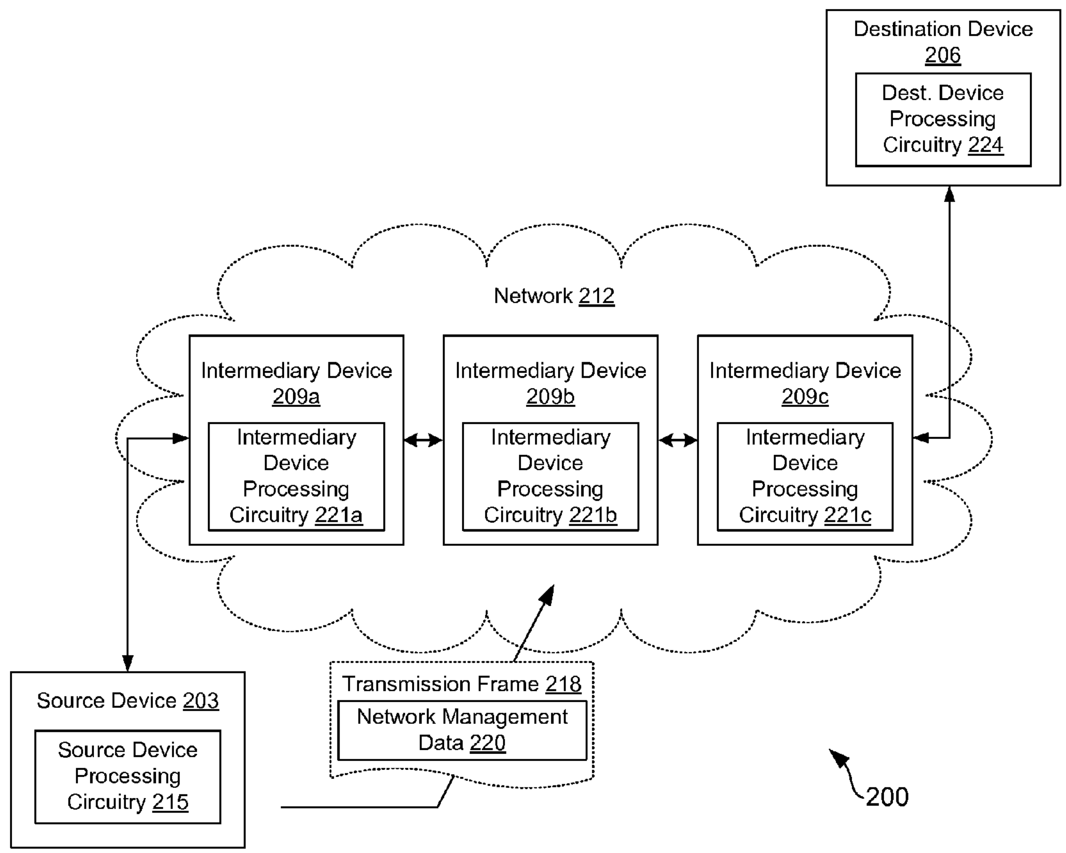
FIG. 2 is a drawing of a networked environment according to various embodiments of the present disclosure.
FIG. 3 is a drawing of an alignment marker format according to various embodiments of the present disclosure.

Referring next to FIG. 2, shown is an example of a networked environment 200 according to various embodiments of the present disclosure. The networked environment 200 may comprise, for example, a network center, a data center, a high performance computing datacenter, or any other type of networked computing environment. The networked environment 200 includes multiple network devices. For example, the embodiment shown in FIG. 2 includes a source device 203, a destination device 206, and one or more intermediary devices 209. The network 212 is operable to facilitate data communication among the source device 203, the destination device 206, the intermediary devices 209, and/or potentially other network devices.

The source device 203 is representative of multiple source devices 203 that may be in communication with the network 212. According to various embodiments, the source device 203 may comprise a processor-based system, such as a server computer, a switch, a router, or any other suitable communication device. The source device 203 is operable to transmit and receive data to and from the destination device 206 and/or other devices using the network 212. To this end, the source device 203 comprises source device processing circuitry 215 and potentially other components and/or functionality. The source device processing circuitry 215 may, for example, generate data, format data, transmit data, and/or perform other processing functionality. As such, the source device processing circuitry 215 may comprise, for example, a network interface card (NIC), a transceiver physical layer (PHY), and/or other types of components.

The source device 203 generates and transmits transmission frames 218 (e.g., Ethernet frames or data packets) to the destination device 206 and/or other devices using the network 212. The destination device 206 and potentially other devices may generate transmission frames 218 as well. A transmission frame 218 comprises framed data that is suitable for transmission in the network 212. The transmission frame 218, for example, may comprise control data and payload data, wherein the control data facilitates the routing and transmission of the payload data in the transmission frame 218. The transmission frame 218 may also comprise network management data 220 that is located in, for example, portions of the transmission frame 218, as will be discussed in greater detail below.

The intermediary devices 209 are representative of one or more intermediary devices 209*a*, 209*b*, and/or 209*c* (and so forth) that may be present in the network 212. In the non-limiting example of FIG. 2, the intermediary device 209*a* is the first communication device in the network 212 that a transmission frame 218 encounters after being transmitted by the source device 203.

In the example of FIG. 2, the intermediary devices 209 may route and transfer the transmission frames 218 within the network 212. To this end, the intermediary devices 209 comprise intermediary device processing circuitry 221 and potentially other components and/or functionality. The intermediary device processing circuitry 221 is operable to receive a transmission frame 218 from the source device 203, process the transmission frame 218, and route and transmit the transmission frame 218 in the network 212.

The destination device 206 is representative of multiple destination devices 206 that may be in communication with the network 212. The destination device 206 is operable to receive transmission frames 218 from the network 212. To this end, the destination device 206 comprises destination device processing circuitry 224 and potentially other components and/or functionality. According to various embodiments, the destination device 206 may comprise a processor-based or processor-less system, such as a server computer, a switch, a network controller, a router, or any other suitable communication device. The destination device processing circuitry 224 may, for example, receive a transmission frame 218, remove the network management data 220 in the transmission frame 218, and process the network management data 220 in the transmission frame 218. As such, the destination device processing circuitry 224 may comprise, for example, a network interface card (NIC), a transceiver physical layer (PHY), and/or other types of components.

Next, a discussion of an example of the operation of the networked environment 200 is provided. In the following discussion, it is assumed that the source device 203 and the destination device 206 are in communication with the network 212.

The source device 203 may prepare to transmit a transmission frame 218 that comprises network management data 220 that is to be transmitted as at least a portion of the payload. Such network management data 220 may be generated by and originate from the source device 203. Alternatively, another communication device may generate the network management data 220, and the source device 203 may receive the network management data 220 from the other device and then transmit the network management data 220 in the transmission frame 218 on behalf of the other device.

As may be appreciated, transmission frames 218 may comprise error detection codes (error codes) that facilitate reliable delivery of data over communication channels. Accordingly, in various embodiments, the source device processing circuitry 215 may encode an error code for a monitored portion of network data for transmission in a first block within the transmission frame 218. Further, the source device processing circuitry 215 may encode network management data 220 in a second block of the transmission frame 218 without modification of the payload data and without the use of additional transmission frames 218. According to various embodiments, the network management data 220 may be encoded according to a predefined block code, wherein the predefined block code generates a plurality of bits comprising the network management 220 to maintain a DC balance between the error code and the network management data 220. The source device processing circuit 215 may generate or otherwise configure the transmission frame 218 comprising at least the first block and the second block for transmission to the destination device 206. According to various embodiments, the destination device 206 may comprise a TOR device 113 (or an EOR device) that may be configured to process the network management data 220 within the transmission frame 218 to configure or reconfigure various components within an equipment rack 101 according to the network management data 220. Generation of the transmission packet 218 comprising network management data 220 will be discussed in greater detail below.

Turning now to FIG. 3, shown is an exemplary structure of an alignment marker 300 that may be employed as a transmission frame 218, or at least a portion of a transmission frame 218, according to various embodiments of the present disclosure. In the non-limiting example of FIG. 3, an alignment marker 300 may comprise 66 bits, although other lengths of bits may be employed, as can be appreciated. A header 303, may comprise 10 bits of the alignment marker 300 and may comprise control information used in, for example, the routing of the alignment marker 300 from a source device 203 to a destination device 206.

A first portion 306 of the alignment marker 300 may comprise one or more "words," or a plurality of bits, that represent at least a portion of a payload of the alignment marker 300. In the non-limiting example of FIG. 3, each word of the first portion 306 has a length of 8 bits and is denoted by $M_0$, $M_1$, and $M_2$. Similarly, a second portion 309 of the alignment marker 300 may comprise one or more words representing at least a portion of the payload of the alignment marker 300. In the non-limiting example of FIG. 3, each word of the second portion 309 has a length of 8 bits and is denoted by $M_4$, $M_5$, and $M_6$.

Bit-interleaved parity (BIP) code is a method of monitoring error rates of network links (e.g., Ethernet links). An X-bit BIP error code (BIP-X) may be generated for a monitored portion (e.g., monitored payload blocks) having even parity for transmission over a specific portion, or block, of a transmission frame 218. A first bit-interleaved parity block 312 may comprise, for example, an error detection code in a first BIP format. In the non-limiting example of FIG. 3, the first BIP format may comprise bit-interleaved parity-3 (BIP-3) comprising an error detection code of 8 bits. BIP-3 may comprise, for example, 8 parity bits to quickly estimate a bit error rate (BER) for a monitored portion of data at a PHY layer. An equivalent bit error rate ($BER_{Equivalent}$) may be determined via:

$$BER_{Equivalent} = \frac{\text{Number of Errored Blocks/Second}}{\text{Total Number of Bits/Second}} \quad \text{(eq. 1)}$$

Similarly, a second bit-interleaved parity block 315 may comprise, for example, an error detection code in a second BIP format. In the non-limiting example of FIG. 3, the second BIP format may comprise bit-interleaved parity-7 (BIP-7) comprising an error detection code of 8 bits. As may be appreciated, in various structures of alignment markers 300, the second BIP block 315 may comprise a bitwise inverse (XOR) of the bits in the first BIP block 312 to maintain a DC balance in the alignment marker 300. For example, a BIP-7 word may be determined to maintain DC balance with respect to a BIP-3 word via:

$$Bits_{BIP\text{-}7} = \sim(Bits_{BIP\text{-}3}) \quad \text{(eq. 2).}$$

As can be appreciated, a primary use of a BIP-7 block 315 is to maintain DC parity with the BIP-3 block 312. However, all or at least a portion of the bits in the second BIP block 315 may be dedicated for encoding network management data 220 while maintaining the DC balance. Accordingly, network management data 220 may be transmitted in otherwise existing transmission frames 218 while maintaining DC balance in the alignment marker 300.

As a non-limiting example, all 8 bits in an 8-bit second BIP block 315 may be used to encode network management data 220. The 8 bits representing network management data 220 may be encoded according to a block code so that the resulting bits maintain DC balance in the transmission frame 218, while comprising network management data 200. In another example, 5 bits in the 8-bit second BIP block 315, or any other subset of bits, may be employed to encode network management data 220. For example, the 5 bits may be used to encode network management data 220. The remaining 3 bits may be determined such that DC balance is maintained in the transmission frame 218. Thus, the plurality of remaining bits in the second bit-interleaved parity block is to generate a uniform block comprising both the encoded network management data (e.g., the 5 bits) and the resulting bits (e.g., the 3 bits) encoded to maintain DC balance between the uniform block and the first BIP block 312. Accordingly, network management data 220 may be encoded in existing transmission frames 218 without necessitating separate transmission of the network management data 220 as a payload in a plurality of transmission frames 218, thereby avoiding an increase in bandwidth of a network 212.

As may be appreciated, the transmission frames 218 may be employed in various technologies for sending transmission frames 218 such as 40 Gigabit Ethernet (40 GbE), 100 Gigabit Ethernet (100 GbE), and/or other technologies. Tables 1 and 2 below show examples of 40 GbE and 100 GbE distinct personal communication service (PCS) lane markers, respectively, which may include the first BIP block 312 (e.g., a BIP-3 block) and the second BIP block 315 (e.g., a BIP-7 block).

TABLE 1

40 GbE PCS Lane Alignment Encoding

| PCS Lane Number | Encoding $\{M_0, M_1, M_2, BIP_3, M_4, M_5, M_6, BIP_7\}$ |
|---|---|
| 0 | 0x90, 0x76, 0x47, $BIP_3$, 0x64, 0x89, 0xB8, $BIP_7$ |
| 1 | 0xF0, 0xC4, 0xE6, $BIP_3$, 0x0F, 0x3B, 0x19, $BIP_7$ |
| 2 | 0xC5, 0x65, 0x9B, $BIP_3$, 0x3A, 0x9A, 0x64, $BIP_7$ |
| 3 | 0xA2, 0x79, 0x3D, $BIP_3$, 0x5D, 0x86, 0xC2, $BIP_7$ |

TABLE 2

| 100 GbE PCS Lane Alignment Encoding | |
|---|---|
| PCS Lane Number | Encoding $\{M_0, M_1, M_2, BIP_3, M_4, M_5, M_6, BIP_7\}$ |
| 0 | 0x90, 0x76, 0x47, BIP$_3$, 0x64, 0x89, 0xB8, BIP$_7$ |
| 1 | 0xF0, 0xC4, 0xE6, BIP$_3$, 0x0F, 0x3B, 0x19, BIP$_7$ |
| 2 | 0xC5, 0x65, 0x9B, BIP$_3$, 0x3A, 0x9A, 0x64, BIP$_7$ |
| 3 | 0xA2, 0x79, 0x3D, BIP$_3$, 0x5D, 0x86, 0xC2, BIP$_7$ |
| 4 | 0x90, 0x76, 0x47, BIP$_3$, 0x64, 0x89, 0xB8, BIP$_7$ |
| 5 | 0xDD, 0x14, 0xC2, BIP$_3$, 0x22, 0xEB, 0x3D, BIP$_7$ |
| 6 | 0x90, 0x76, 0x47, BIP$_3$, 0x64, 0x89, 0xB8, BIP$_7$ |
| 7 | 0x7B, 0x45, 0x66, BIP$_3$, 0x84, 0xBA, 0x99, BIP$_7$ |
| 8 | 0xA0, 0x24, 0x76, BIP$_3$, 0x5F, 0xDB, 0x89, BIP$_7$ |
| 9 | 0x68, 0xC9, 0xFB, BIP$_3$, 0x97, 0x36, 0x04, BIP$_7$ |
| 10 | 0xFD, 0x6C, 0x99, BIP$_3$, 0x02, 0x93, 0x66, BIP$_7$ |
| 11 | 0xB9, 0x91, 0x55, BIP$_3$, 0x46, 0x6E, 0xAA, BIP$_7$ |
| 12 | 0x5C, 0xB9, 0xB2, BIP$_3$, 0xA3, 0x46, 0x4D, BIP$_7$ |
| 13 | 0x1A, 0xF8, 0xBD, BIP$_3$, 0xE5, 0x07, 0x42, BIP$_7$ |
| 14 | 0x83, 0xC7, 0xCA, BIP$_3$, 0x7C, 0x38, 0x35, BIP$_7$ |
| 15 | 0x35, 0x36, 0xCD, BIP$_3$, 0xCA, 0x7C, 0x38, BIP$_7$ |
| 16 | 0xC4, 0x31, 0x4C, BIP$_3$, 0x3B, 0xCE, 0xB3, BIP$_7$ |
| 17 | 0xAD, 0xD6, 0xB7, BIP$_3$, 0x52, 0x29, 0x48, BIP$_7$ |
| 18 | 0x5F, 0x66, 0x2A, BIP$_3$, 0xA0, 0x99, 0xD5, BIP$_7$ |
| 19 | 0xC0, 0xF6, 0xE5, BIP$_3$, 0x3F, 0x0F, 0x1A, BIP$_7$ |

According to various embodiments, a source device 203, a destination device 206, or any other communication device may comprise, for example, a gearbox PHY. The structure of multi-link gearbox (MLG) 1.0 PCS lane numbers are similar to Ethernet multi-link device (MLD) PCS lane numbers, however, with new distinct PCS lane numbers. For example, MLG 1.0 PCS lane numbers also include a BIP-3 block and a BIP-7 block. Table 3 below shows an example of 4×25 MLG lane alignment marker values which may include a BIP-3 block and a BIP-7 block.

TABLE 3

| 4x25G MLG Lane Alignment Marker Values | | | |
|---|---|---|---|
| MLG Lane Number | Encoding $\{M_0, M_1, M_2, BIP_3, M_4, M_5, M_6, BIP_7\}$ | MLG Lane Number | Encoding $\{M_0, M_1, M_2, BIP_3, M_4, M_5, M_6, BIP_7\}$ |
| 0.0 | 0x80, 0xB4, 0xAF, BIP$_3$, 0x7F, 0x4B, 0x50, BIP$_7$ | 0.1 | 0x29, 0x85, 0x1D, BIP$_3$, 0xD6, 0x7A, 0xE2, BIP$_7$ |
| 1.0 | 0x11, 0x2A, 0xD8, BIP$_3$, 0xEE, 0xD5, 0x27, BIP$_7$ | 1.1 | 0xBF, 0x7E, 0xfD, BIP$_3$, 0x40, 0x81, 0xB2, BIP$_7$ |
| 2.0 | 0x7C, 0x3F, 0x1C, BIP$_3$, 0x83, 0xC0, 0xE3, BIP$_7$ | 2.1 | 0xEE, 0x8B, 0xBA, BIP$_3$, 0x11, 0x74, 0x45, BIP$_7$ |
| 3.0 | 0xD1, 0x87, 0x25, BIP$_3$, 0x2E, 0x78, 0xDA, BIP$_7$ | 3.1 | 0xD0, 0x02, 0x39, BIP$_3$, 0x2F, 0xFD, 0xC6, BIP$_7$ |
| 4.0 | 0x6D, 0xFE, 0x11, BIP$_3$, 0x92, 0x01, 0xEE, BIP$_7$ | 4.1 | 0xA1,0xD2, 0xAB, BIP$_3$, 0x5E, 0x2D, 0x54, BIP$_7$ |
| 5.0 | 0x0E, 0xC6, 0x3C, BIP$_3$, 0xF1, 0x39, 0xC3, BIP$_7$ | 5.1 | 0x98, 0x78, 0x07, BIP$_3$, 0x67, 0x87, 0xF8, BIP$_7$ |
| 6.0 | 0x1B, 0xBF, 0xA0, BIP$_3$, 0xE4, 0x40, 0x5F, BIP$_7$ | 6.1 | 0x31, 0x90, 0xC3, BIP$_3$, 0xCE, 0x6F, 0x3C, BIP$_7$ |
| 7.0 | 0x0D, 0x9A, 0x46, BIP$_3$, 0xF2, 0x65, 0xB9, BIP$_7$ | 7.1 | 0x9F, 0x08, 0xB6, BIP$_3$, 0x60, 0xF7, 0x49, BIP$_7$ |
| 8.0 | 0xBB, 0x55, 0x9D, BIP$_3$, 0x44, 0xAA, 0x62, BIP$_7$ | 8.1 | 0xA8, 0x05, 0xFC, BIP$_3$, 0x57, 0xFA, 0x03, BIP$_7$ |
| 9.0 | 0x04, 0xA1, 0x94, BIP$_3$, 0xFB, 0x5E, 0x6B, BIP$_7$ | 9.1 | 0x07, 0x72, 0xDB, BIP$_3$, 0xF8, 0x8D, 0x24, BIP$_7$ |

MLG 2.0, as opposed to MLG 1.0, comprises two modes of operation: 4×25G and 8×25G. Tables 4 and 5 below show examples of the PCS lane numbers of 4×25G and 8×25G modes, respectively.

TABLE 4

| 4x25G MLG Lane Alignment Marker Values | | | |
|---|---|---|---|
| MLG Lane Number | Encoding $\{M_0, M_1, M_2, BIP_3, M_4, M_5, M_6, BIP_7\}$ | MLG Lane Number | Encoding $\{M_0, M_1, M_2, BIP_3, M_4, M_5, M_6, BIP_7\}$ |
| 0.0-10 | 0x80, 0xB4, 0xAF, BIP$_3$, 0x7F, 0x4B, 0x50, BIP$_7$ | 0.1 | 0x29, 0x85, 0x1D, BIP$_3$, 0xD6, 0x7A, 0xE2, BIP$_7$ |
| 0.0-40 | 0x89, 0x40, 0x9F, BIP$_3$, 0x76, 0xBF, 0x60, BIP$_7$ | | |
| 1.0-10 | 0x11, 0x2A, 0xD8, BIP$_3$, 0xEE, 0xD5, 0x27, BIP$_7$ | 1.1 | 0xBF, 0x7E, 0xfD, BIP$_3$, 0x40, 0x81, 0xB2, BIP$_7$ |
| 1.0-40 | 0xAA, 0x39, 0xE3, BIP$_3$, 0x55, 0xC6, 0x1C, BIP$_7$ | | |
| 2.0-10 | 0x7C, 0x3F, 0x1C, BIP$_3$, 0x83, 0xC0, 0xE3, BIP$_7$ | 2.1 | 0xEE, 0x8B, 0xBA, BIP$_3$, 0x11, 0x74, 0x45, BIP$_7$ |
| 2.0-40 | 0x14, 0x6B, 0xD7, BIP$_3$, 0xEB, 0x94, 0x28, BIP$_7$ | | |
| 3.0-10 | 0xD1, 0x87, 0x25, BIP$_3$, 0x2E, 0x78, 0xDA, BIP$_7$ | 3.1 | 0xD0, 0x02, 0x39, BIP$_3$, 0x2F, 0xFD, 0xC6, BIP$_7$ |
| 3.0-40 | 0xE1, 0xDB, 0x6C, BIP$_3$, 0x1E, 0x24, 0x93, BIP$_7$ | | |
| 4.0-10 | 0x6D, 0xFE, 0x11, BIP$_3$, 0x92, 0x01, 0xEE, BIP$_7$ | 4.1 | 0xA1, 0xD2, 0xAB, BIP$_3$, 0x5E, 0x2D, 0x54, BIP$_7$ |
| 4.0-40 | 0x39, 0xB8, 0x5C, BIP$_3$, 0xC6, 0x47, 0xA3, BIP$_7$ | | |
| 5.0-10 | 0x0E, 0xC6, 0x3C, BIP$_3$, 0xF1, 0x39, 0xC3, BIP$_7$ | 5.1 | 0x98, 0x78, 0x07, BIP$_3$, 0x67, 0x87, 0xF8, BIP$_7$ |
| 5.0-40 | 0x4A, 0x59, 0x12, BIP$_3$, 0xB5, 0xA6, 0xED, BIP$_7$ | | |
| 6.0-10 | 0x1B, 0xBF, 0xA0, BIP$_3$, 0xE4, 0x40, 0x5F, BIP$_7$ | 6.1 | 0x31, 0x90, 0xC3, BIP$_3$, 0xCE, 0x6F, 0x3C, BIP$_7$ |
| 6.0-40 | 0x55, 0xD3, 0xC6, BIP$_3$, 0xAA, 0x2C, 0x39, BIP$_7$ | | |
| 7.0-10 | 0x0D, 0x9A, 0x46, BIP$_3$, 0xF2, 0x65, 0xB9, BIP$_7$ | 7.1 | 0x9F, 0x08, 0xB6, BIP$_3$, 0x60, 0xF7, 0x49, BIP$_7$ |
| 7.0-40 | 0xB6, 0xA2, 0xCF, BIP$_3$, 0x49, 0x5D, 0x30, BIP$_7$ | | |
| 8.0 | 0xBB, 0x55, 0x9D, BIP$_3$, 0x44, 0xAA, 0x62, BIP$_7$ | 8.1 | 0xA8, 0x05, 0xFC, BIP$_3$, 0x57, 0xFA, 0x03, BIP$_7$ |
| 9.0 | 0x04, 0xA1, 0x94, BIP$_3$, 0xFB, 0x5E, 0x6B, BIP$_7$ | 9.1 | 0x07, 0x72, 0xDB, BIP$_3$, 0xF8, 0x8D, 0x24, BIP$_7$ |

TABLE 5

| 8x25G MLG Lane Alignment Marker Values | | | |
|---|---|---|---|
| MLG Lane Number | Encoding $\{M_0, M_1, M_2, BIP_3, M_4, M_5, M_6, BIP_7\}$ | MLG Lane Number | Encoding $\{M_0, M_1, M_2, BIP_3, M_4, M_5, M_6, BIP_7\}$ |
| 0.0-10 | 0x80, 0xB4, 0xAF, BIP$_3$, 0x7F, 0x4B, 0x50, BIP$_7$ | 0.1 | 0x29, 0x85, 0x1D, BIP$_3$, 0xD6, 0x7A, 0xE2, BIP$_7$ |
| 0.0-40 | 0x89, 0x40, 0x9F, BIP$_3$, 0x76, 0xBF, 0x60, BIP$_7$ | | |
| 1.0-10 | 0x11, 0x2A, 0xD8, BIP$_3$, 0xEE, 0xD5, 0x27, BIP$_7$ | 1.1 | 0xBF, 0x7E, 0xfD, BIP$_3$, 0x40, 0x81, 0xB2, BIP$_7$ |
| 1.0-40 | 0xAA, 0x39, 0xE3, BIP$_3$, 0x55, 0xC6, 0x1C, BIP$_7$ | | |
| 2.0-10 | 0x7C, 0x3F, 0x1C, BIP$_3$, 0x83, 0xC0, 0xE3, BIP$_7$ | 2.1 | 0xEE, 0x8B, 0xBA, BIP$_3$, 0x11, 0x74, 0x45, BIP$_7$ |
| 2.0-40 | 0x14, 0x6B, 0xD7, BIP$_3$, 0xEB, 0x94, 0x28, BIP$_7$ | | |
| 3.0-10 | 0xD1, 0x87, 0x25, BIP$_3$, 0x2E, 0x78, 0xDA, BIP$_7$ | 3.1 | 0xD0, 0x02, 0x39, BIP$_3$, 0x2F, 0xFD, 0xC6, BIP$_7$ |
| 3.0-40 | 0xE1, 0xDB, 0x6C, BIP$_3$, 0x1E, 0x24, 0x93, BIP$_7$ | | |
| 4.0-10 | 0x6D, 0xFE, 0x11, BIP$_3$, 0x92, 0x01, 0xEE, BIP$_7$ | 4.1 | 0xA1, 0xD2, 0xAB, BIP$_3$, 0x5E, 0x2D, 0x54, BIP$_7$ |
| 4.0-40 | 0x39, 0xB8, 0x5C, BIP$_3$, 0xC6, 0x47, 0xA3, BIP$_7$ | | |
| 5.0-10 | 0x0E, 0xC6, 0x3C, BIP$_3$, 0xF1, 0x39, 0xC3, BIP$_7$ | 5.1 | 0x98, 0x78, 0x07, BIP$_3$, 0x67, 0x87, 0xF8, BIP$_7$ |
| 5.0-40 | 0x4A, 0x59, 0x12, BIP$_3$, 0xB5, 0xA6, 0xED, BIP$_7$ | | |

TABLE 5-continued

8x25G MLG Lane Alignment Marker Values

| MLG Lane Number | Encoding $\{M_0, M_1, M_2, BIP_3, M_4, M_5, M_6, BIP_7\}$ | MLG Lane Number | Encoding $\{M_0, M_1, M_2, BIP_3, M_4, M_5, M_6, BIP_7\}$ |
|---|---|---|---|
| 6.0-10 | 0x1B, 0xBF, 0xA0, $BIP_3$, 0xE4, 0x40, 0x5F, $BIP_7$ | 6.1 | 0x31, 0x90, 0xC3, $BIP_3$, 0xCE, 0x6F, 0x3C, $BIP_7$ |
| 6.0-40 | 0x55, 0xD3, 0xC6, $BIP_3$, 0xAA, 0x2C, 0x39, $BIP_7$ | | |
| 7.0-10 | 0x0D, 0x9A, 0x46, $BIP_3$, 0xF2, 0x65, 0xB9, $BIP_7$ | 7.1 | 0x9F, 0x08, 0xB6, $BIP_3$, 0x60, 0xF7, 0x49, $BIP_7$ |
| 7.0-40 | 0xB6, 0xA2, 0xCF, $BIP_3$, 0x49, 0x5D, 0x30, $BIP_7$ | | |
| 8.0-10 | 0xBB, 0x55, 0x9D, $BIP_3$, 0x44, 0xAA, 0x62, $BIP_7$ | 8.1 | 0xA8, 0x05, 0xFC, $BIP_3$, 0x57, 0xFA, 0x03, $BIP_7$ |
| 8.0-40 | 0x20, 0x37, 0x16, $BIP_3$, 0xDF, 0xC8, 0xE9, $BIP_7$ | | |
| 9.0-10 | 0x04, 0xA1, 0x94, $BIP_3$, 0xFB, 0x5E, 0x6B, $BIP_7$ | 9.1 | 0x07, 0x72, 0xDB, $BIP_3$, 0xF8, 0x8D, 0x24, $BIP_7$ |
| 9.0-40 | 0xCA, 0xBC, 0x1A, $BIP_3$, 0x35, 0x43, 0xE5, $BIP_7$ | | |
| 10.0-10 | 0x37, 0xA0, 0x0D, $BIP_3$, 0xC8, 0x5F, 0xF2, $BIP_7$ | 10.1 | 0xE6, 0xEF, 0x8C, $BIP_3$, 0x19, 0x10, 0x73, $BIP_7$ |
| 10.0-40 | 0x7F, 0xC0, 0xCC, $BIP_3$, 0x80, 0x3F, 0x33, $BIP_7$ | | |
| 11.0-10 | 0x6A, 0xD9, 0x73, $BIP_3$, 0x95, 0x26, 0x8C, $BIP_7$ | 11.1 | 0x41, 0xDE, 0x0A, $BIP_3$, 0xBE, 0x21, 0xF5, $BIP_7$ |
| 11.0-40 | 0x32, 0xFA, 0xE2, $BIP_3$, 0xCD, 0x05, 0x1D, $BIP_7$ | | |
| 12.0-10 | 0xDF, 0x13, 0x45, $BIP_3$, 0x20, 0xEC, 0xBA, $BIP_7$ | 12.1 | 0x8D, 0x0D, 0xBC, $BIP_3$, 0x72, 0xF2, 0x43, $BIP_7$ |
| 12.0-40 | 0xD6, 0x9B, 0x18, $BIP_3$, 0x29, 0x64, 0xE7, $BIP_7$ | | |
| 13.0-10 | 0x43, 0xBB, 0x33, $BIP_3$, 0xBC, 0x44, 0xCC, $BIP_7$ | 13.1 | 0xD2, 0xE9, 0x97, $BIP_3$, 0x2D, 0x16, 0x68, $BIP_7$ |
| 13.0-40 | 0x4E, 0xBA, 0x03, $BIP_3$, 0xB1, 0x45, 0xFC, $BIP_7$ | | |
| 14.0-10 | 0x2D, 0x17, 0x04, $BIP_3$, 0xD2, 0xE8, 0xFB, $BIP_7$ | 14.1 | 0x3A, 0x83, 0x31, $BIP_3$, 0xC5, 0x7C, 0xCE, $BIP_7$ |
| 14.0-40 | 0xC6, 0x57, 0x48, $BIP_3$, 0x39, 0xA8, 0xB7, $BIP_7$ | | |
| 15.0-10 | 0xED, 0xCD, 0x5E, $BIP_3$, 0x12, 0x32, 0xA1, $BIP_7$ | 15.1 | 0x65, 0xB2, 0x32, $BIP_3$, 0x9A, 0x4D, 0xCD, $BIP_7$ |
| 15.0-40 | 0xEF, 0x22, 0x4A, $BIP_3$, 0x10, 0xDD, 0xB5, $BIP_7$ | | |
| 16.0-10 | 0x2B, 0x1A, 0x05, $BIP_3$, 0xD4, 0xE5, 0xFA, $BIP_7$ | 16.1 | 0x22, 0x0C, 0xDC, $BIP_3$, 0xDD, 0xF3, 0x23, $BIP_7$ |
| 16.0-40 | 0x4B, 0x5C, 0x41, $BIP_3$, 0xB4, 0xA3, 0xBE, $BIP_7$ | | |
| 17.0-10 | 0x47, 0xAE, 0x79, $BIP_3$, 0xB8, 0x51, 0x86, $BIP_7$ | 17.1 | 0xB8, 0xA3, 0xD6, $BIP_3$, 0x47, 0x5C, 0x29, $BIP_7$ |
| 17.0-40 | 0x69, 0x19, 0xAE, $BIP_3$, 0x96, 0xE6, 0x51, $BIP_7$ | | |
| 18.0-10 | 0xC3, 0xF7, 0x82, $BIP_3$, 0x3C, 0x08, 0x7D, $BIP_7$ | 18.1 | 0xCD, 0x0A, 0x6F, $BIP_3$, 0x32, 0xF5, 0x90, $BIP_7$ |
| 18.0-40 | 0x86, 0x8D, 0xC5, $BIP_3$, 0x79, 0x72, 0x3A, $BIP_7$ | | |
| 19.0-10 | 0x21, 0xCE, 0xB9, $BIP_3$, 0xDE, 0x31, 0x46, $BIP_7$ | 19.1 | 0x8E, 0x81, 0x3B, $BIP_3$, 0x71, 0x7E, 0xC4, $BIP_7$ |
| 19.0-40 | 0x09, 0xF2, 0xA6, $BIP_3$, 0xF6, 0x0D, 0x59, $BIP_7$ | | |

Further, 40 GbE Ethernet and 100 GbE Ethernet links, as well as Optical Internetworking Forum (OIF) MLG definition of 4×25G and 8×25G, embed BIP-3 and BIP-7 blocks into respective PCS lane numbers. As discussed above, BIP-3 is an 8 parity bit word that may be used to quickly estimate a BER for a network link. IEEE 802.3 clause 82 defines a parity definition for BIP-3. An example of BIP-3 value assignment is shown below in Table 6.

TABLE 6

BIP3 Value Assignment

| BIP-3 Bit Number | Assigned 66-bit Word Bits |
|---|---|
| 0 | 2, 10, 18, 26, 34, 42, 50, 58 |
| 1 | 3, 11, 19, 27, 35, 43, 51, 59 |
| 2 | 4, 12, 20, 28, 36, 44, 52, 60 |
| 3 | 0, 5, 13, 21, 29, 37, 45, 53, 61 |
| 4 | 1, 6, 14, 22, 30, 38, 46, 54, 62 |
| 5 | 7, 15, 24, 31, 39, 47, 55, 63 |
| 6 | 8, 16, 24, 32, 40, 48, 56, 64 |
| 7 | 9, 17, 25, 33, 41, 49, 57, 65 |

For example, BIP-3, bit 0, is an exclusive or of bits 2, 10, 18, 26, 34, 42, 50, 58 from a 66-bit word. Because BIP-7 may be a bitwise inversion of BIP-3, it is capable of being used to carry network management data 220 between two communication devices, such as host and a client, without the need of a separate Ethernet link or console 110. The BIP-3 or BIP-7 block in MLD or MLG traffic can be used to carry point-to-point or multi-point management information between a host and a client or between two hosts. The generation of a DC balanced transmission frame 218 will be discussed in greater detail below.

Figure 4:
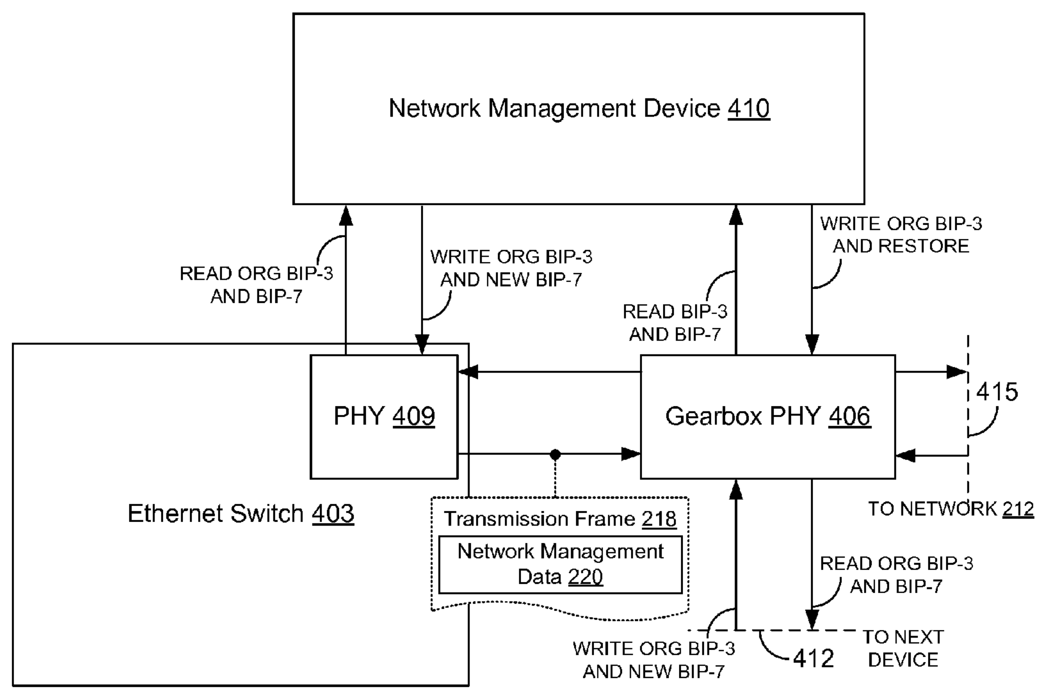
FIG. 4 is a drawing of a portion of a network comprising a first Ethernet switch and a second Ethernet switch according to various embodiments of the present disclosure.

Moving on to FIG. 4, shown is a drawing of a portion of a network comprising an Ethernet switch 403 and a gearbox PHY 406 according to various embodiments of the present disclosure. The Ethernet switch 403 is operable to generate, modify, and/or transmit transmission frames 218 (e.g., Ethernet frames or data packets) to the gearbox PHY 406 and/or other devices over the network 212. As discussed above, the transmission frame 218, for example, may comprise control data and payload data, wherein the control data facilitates the routing and transmission of the payload data in the transmission frame 218 to a communication device. The transmission frame 218 may also comprise network management data 220 that is located in, for example, portions of the transmission frame 218.

Thus, the Ethernet switch 403 may comprise processing circuitry that may, for example, generate data, format data, transmit data, and/or perform other processing functionality. As such, the Ethernet switch 403 may comprise, for example, a network interface card (NIC), a transceiver physical layer (PHY) 409, a field-programmable gate array (FPGA), and/or other types of components. Accordingly, a transmission frame 218 comprising network management data 220 may be read from or written to by a PHY 409, a chip, an FPGA, or any other circuitry within or otherwise in data communication with the Ethernet switch 403.

According to various embodiments, the original BIP-3 data is preserved and the network management data 220 is added to the BIP-7 block 315 while maintaining DC balance. The gearbox PHY 406, upon receipt of the transmission frame 218, reads and monitors the BIP-3 block 312 (FIG. 3) for a BER of a network link, however, the BIP-7 block 315 now contains network management data 220 from the Ethernet switch 403. According to one embodiment, the gearbox PHY 406 may be configured restore the BIP-7 block 315 to its original value (i.e., the bitwise inverse of the BIP-3 block 312). According to another embodiment, the gearbox PHY 406 may refrain from restoring the BIP-7 block 315 to its original value by sending the transmission frame 218 with the BIP-3 block 312 and the BIP-7 block 315 of the transmission frame 218 unchanged.

According to various embodiments, the Ethernet switch 403 and the gearbox PHY 406 may communicate as a host-client arrangement or as a client-client arrangement and may communicate directly or indirectly (i.e., over a network 212) with a network management device 410. Region 412 and region 415 illustrate that the gearbox PHY 406 may communicate with downstream devices or, alternatively, may communicate with the network 212. According to various embodiments, a gearbox PHY 406 may comprise a processorless device, a multi-link distribution (MLD) device, and/or a multi-link gearbox (MLG). For example, the gearbox PHY 406 may comprise the Broadcom® BCM84790 gearbox PHY or the BCM84793 gearbox PHY. In various embodiments, the gearbox PHY 406 may comprise a 10 GbE, 40 GbE, or 100 GbE physical layer device while offering a multi-rate interface for 4-lane (4×25 Gbps) and 10-lane (10×10 Gbps) bi-directional transmissions.

Figure 5:
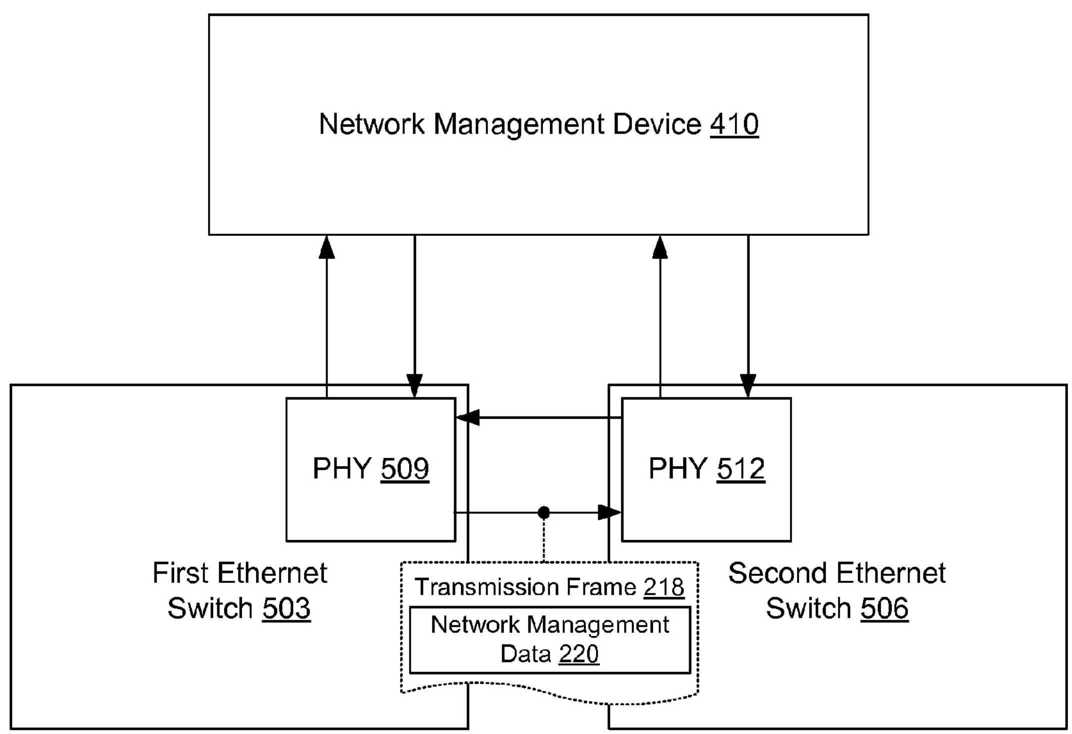
FIG. 5 is a drawing of a portion of a network comprising an Ethernet switch and a gearbox PHY according to various embodiments of the present disclosure.

Referring next to FIG. 5, shown is a drawing of a portion of a network comprising a first Ethernet switch 503 and a second Ethernet switch 506 according to various embodiments of the present disclosure. The first Ethernet switch 503 is operable to generate, modify, and/or transmit transmission frames 218 (e.g., Ethernet frames or data packets) to the second Ethernet frame 506 and/or other devices over the network 212. In addition, the first Ethernet switch 503 and the second Ethernet switch 506 may be in data communication with a network management device 410. As discussed above, the transmission frame 218, for example, may comprise control data and payload data, wherein the control data facilitates the routing and transmission of the payload data in the transmission frame 218 to the second Ethernet switch 506 or any other communication device. The transmission frame 218 may comprise, for example, network management data 220.

Accordingly, the first Ethernet switch 503 and/or the second Ethernet switch 506 may comprise processing circuitry that may, for example, generate data, format data, transmit data, and/or perform other processing functionality. As such, the Ethernet switch 403 may comprise, for example, a network interface card (NIC), a transceiver physical layer (PHY), a field-programmable gate array (FPGA), and/or other types of components. Accordingly, a transmission frame 218 may be read or write network management data 220 by a NIC, a PHY, a chip, an FPGA, or any other circuitry within or otherwise in data communication with the first Ethernet switch 503 or the second Ethernet switch 506. Although the non-limiting example of FIG. 5 depicts a first Ethernet switch 503 and a second Ethernet switch 506, the example is not so limiting. For example, the combination of the first Ethernet switch 503 and the second Ethernet switch 506 may comprise a combination or sub-combination of other communication devices such as a server computer, a switch, a network controller, a router, or any other suitable communication device.

Figure 6:
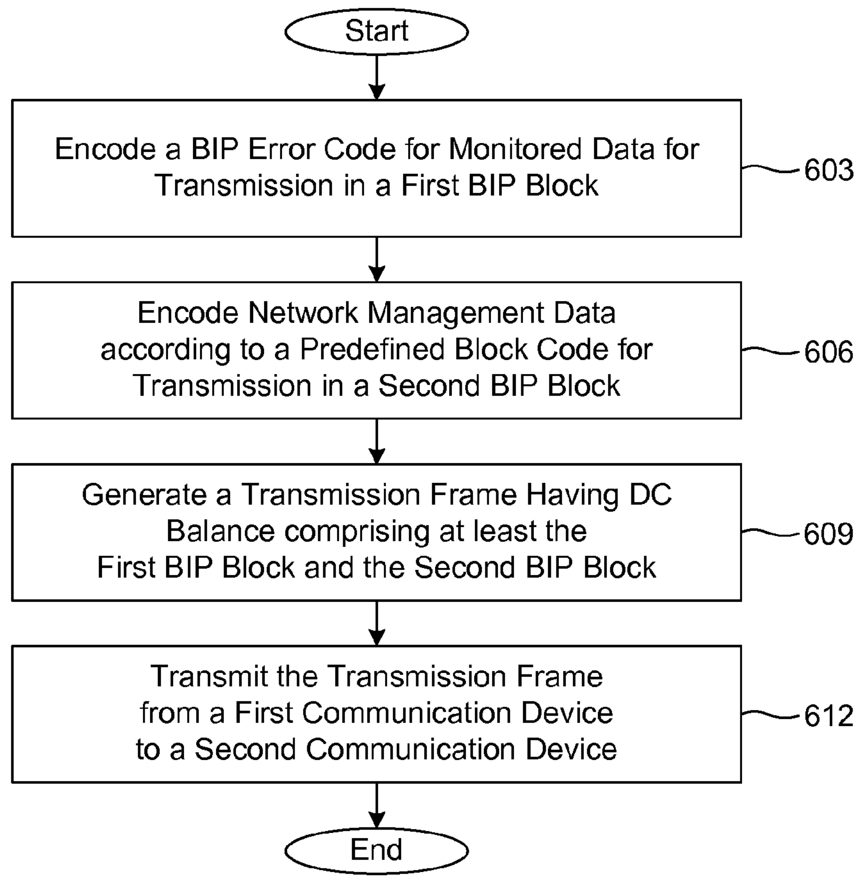
FIG. 6 is a flowchart illustrating one example of functionality implemented as portions of an encoding application executed in a communication device according to various embodiments of the present disclosure.

Turning now to FIG. 6, shown is a flowchart that provides one example of the operation of a portion of the source device processing circuitry 215 according to various embodiments. It is understood that the flowchart of FIG. 6 provides merely an example of the many different types of functional arrangements that may be employed to implement the operation of the portion of the source device processing circuitry 215 as described herein. As an alternative, the flowchart of FIG. 6 may be viewed as depicting an example of elements of a method implemented in a program executable in a processor of the source device 203 (FIG. 2), or any other communication device, according to one or more embodiments.

Beginning with 603, the source device processing circuitry 215 is operable to encode a BIP error code for monitored data for transmission in a first BIP block 312 (FIG. 3). For example, an X-bit BIP error code may be generated for a monitored portion of data (e.g., monitored payload data over a network link) having even parity for transmission in a block of a transmission frame 218. A first BIP block 312 may comprise, for example, an error detection code in a first BIP format. In the non-limiting example of FIG. 3, the first BIP format may comprise BIP-3 having an error detection code of 8 bits. BIP-3 may comprise, for example, 8 parity bits to quickly estimate a bit error rate (BER) for a monitored portion of data at a PHY layer.

In 606, the source device processing circuitry 215 may encode network management data 220 according to a predefined block code for transmission in a second BIP block 315 (FIG. 3) of a transmission frame 218. A second BIP block 315 may comprise, for example, an error detection code in a second BIP format. For example, the second BIP format may comprise BIP-7 having an error detection code of 8 bits. As may be appreciated, in various structures of alignment markers 300, the second BIP block 315 may comprise a bitwise inverse (XOR) of the bits in the first BIP block 312 to maintain a DC balance in the transmission frame 218.

Accordingly, a primary use of a BIP-7 block 315 is to maintain DC parity with the BIP-3 block 312. However, all or at least a portion of the bits in the second BIP block 315 may be dedicated for encoding network management data 220 while maintaining the DC balance. Accordingly, network management data 220 may be transmitted in otherwise existing transmission frames 218 while maintaining DC balance in the alignment marker 300.

As a non-limiting example, all 8 bits in an 8-bit second BIP block 315 may be used to encode network management data 220. The 8 bits representing network management data 220 may be encoded according to a block code so that the resulting bits maintain DC balance in the transmission frame 218, while comprising network management data 200. A block code may comprise, for example, 3B/4B block code, 4B/5B block code, 8B/10B block code, and/or any other block code encoding technique that may encode network management data 220 while maintaining DC balance.

In another example, a portion of bits in the second BIP block 315 (as opposed to all the bits in the second BIP block 315) may be employed to encode network management data 220. As a non-limiting example, 4 bits of the 8-bit second BIP block 315, or any other subset of bits, may be employed to encode network management data 220. The remaining bits in the second BIP block 315 may be determined such that DC balance is maintained in the transmission frame 218. Accordingly, network management data 220 may be encoded in existing transmission frames 218 without necessitating separate transmission of the network management data 220 as a payload in a plurality of transmission frames 218, thereby avoiding an increase in bandwidth of a network 212.

In 609, a transmission frame 218 may be generated or otherwise reconfigured to include both the first BIP block 312 and the second BIP block 315, wherein the transmission frame 218 has DC balance. In 612, the transmission frame 218, comprising the network management data 220, may be transmitted from the source device 203 to a destination device 206. To restate, the transmission frame 218, comprising the network management data 220, may be transmitted from a first communication device to a second communication device.

Figure 7:
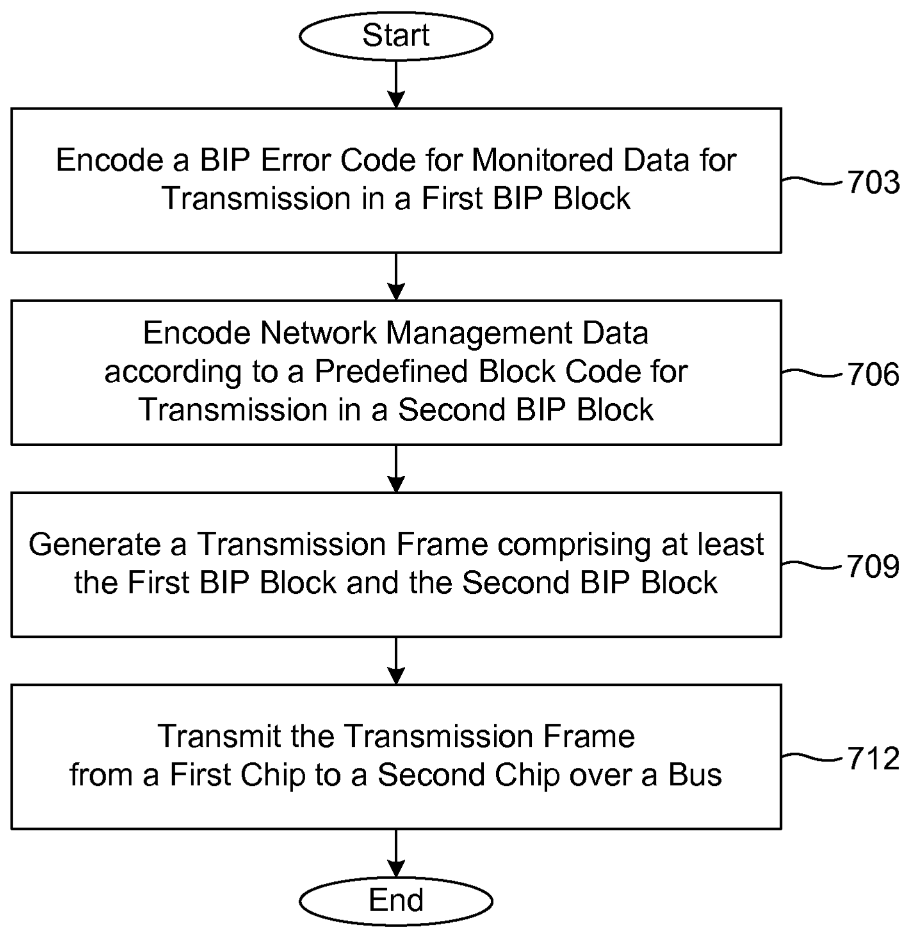
FIG. 7 is a flowchart illustrating one example of functionality implemented as portions of an encoding application executed in a chip according to various embodiments of the present disclosure.

Turning now to FIG. 7, shown is a flowchart that provides one example of the operation of a portion of a communication chip according to various embodiments. It is understood that the flowchart 700 of FIG. 7 provides merely an example of the many different types of functional arrangements that may be employed to implement the operation of the portion of the communication chip as described herein.

Beginning with 703, a first communication chip is operable to encode a BIP error code for monitored data for transmission in a first BIP block 312 (FIG. 3). As described above, an X-bit BIP error code may be generated for a monitored portion of data (e.g., monitored payload data over a bus) having even parity for transmission in a block of a transmission frame 218. A first BIP block 312 may comprise, for example, an error detection code in a first BIP format. In the non-limiting example of FIG. 3, the first BIP format may comprise BIP-3 having an error detection code of 8 bits. BIP-3 may comprise, for example, 8 parity bits to quickly estimate a bit error rate (BER) for a monitored portion of data over the bus.

In 706, the first communication chip is operate to encode management data (as opposed to network management data 220) according to a predefined block code for transmission in a second BIP block 315 (FIG. 3) of a transmission frame 218. A second BIP block 315 may comprise, for example, an error detection code in a second BIP format. For example, the second BIP format may comprise BIP-7 having an error detection code of 8 bits. As may be appreciated, in various structures of alignment markers 300, the second BIP block 315 may comprise a bitwise inverse (XOR) of the bits in the first BIP block 312 to maintain a DC balance in the transmission frame 218.

Accordingly, a primary use of a BIP-7 block 315 is to maintain DC parity with the BIP-3 block 312. However, all or at least a portion of the bits in the second BIP block 315 may be dedicated for encoding management data while maintaining the DC balance. Accordingly, management data may be transmitted in otherwise existing transmission frames 218 while maintaining DC balance in the alignment marker 300.

As a non-limiting example, all 8 bits in an 8-bit second BIP block 315 may be used to encode network management data 220. The 8 bits representing network management data 220 may be encoded according to a block code so that the resulting bits maintain DC balance in the transmission frame 218, while comprising network management data 200. A block code may comprise, for example, 3B/4B block code, 4B/5B block code, 8B/10B block code, and/or any other block code that may encode network management data 220 while maintaining DC balance.

In another example, a portion of bits in the second BIP block 315 (as opposed to all the bits in the second BIP block 315) may be employed to encode network management data 220. As a non-limiting example, 4 bits of the 8-bit second BIP block 315, or any other subset of bits, may be employed to encode network management data 220. The remaining bits in the second BIP block 315 may be determined such that DC balance is maintained in the transmission frame 218. Accordingly, management data may be encoded in existing transmission frames 218 without necessitating separate transmission of the management data as a payload in a plurality of transmission frames 218, thereby avoiding an increase of data on the bus.

In 709, a transmission frame 218 may be generated or otherwise reconfigured to include both the first BIP block 312 and the second BIP block 315, wherein the transmission frame 218 has a DC balance. In 712, the transmission frame 218, comprising the management data, may be transmitted from the first chip to a second chip.

Figure 8:
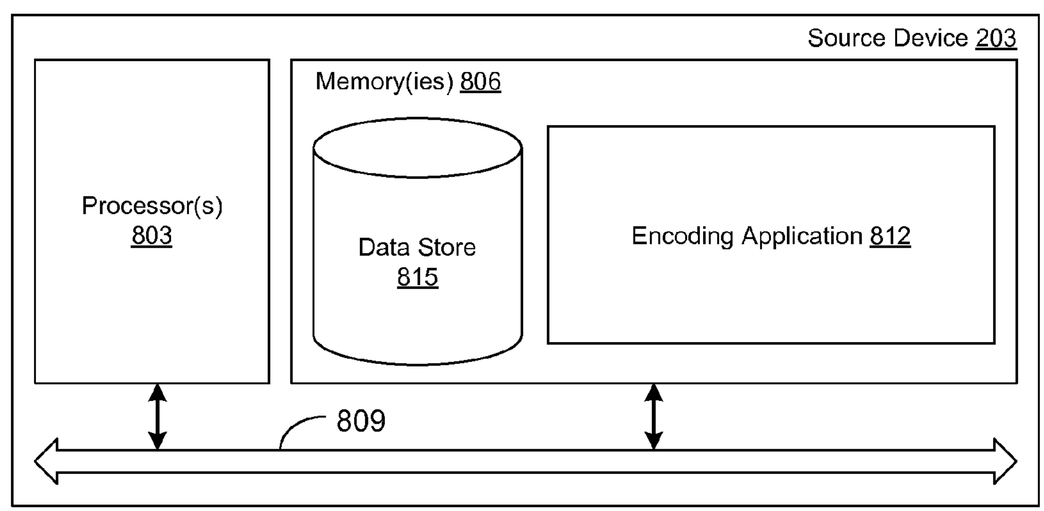
FIG. 8 is a schematic block diagram that provides one example illustration of a computing environment employed in the networked environment of FIG. 2 according to various embodiments of the present disclosure.

With reference to FIG. 8, shown is a schematic block diagram of the source device 203 according to an embodiment of the present disclosure. According to various embodiments, the source device 203 may comprise at least one processor circuit, for example, having a processor 803 and a memory 806, both of which are coupled to a local interface 809. The local interface 809 may comprise, for example, a data bus with an accompanying address/control bus or other bus structure as can be appreciated.

Stored in the memory 806 are both data and several components that are executable by the processor 803. In particular, stored in the memory 806 and executable by the processor 803 is an encoding application 812 that performs the operations depicted in FIGS. 6 and 7, and potentially other applications. Also stored in the memory 806 may be a data store 815 and other data. In addition, an operating system may be stored in the memory 806 and executable by the processor 803.

It is understood that there may be other applications that are stored in the memory 806 and are executable by the processor 803 as can be appreciated. Where any component discussed herein is implemented in the form of software, any one of a number of programming languages may be employed such as, for example, C, C++, C#, Objective C, Java®, JavaScript®, Perl, PHP, Visual Basic®, Python®, Ruby, Flash®, or other programming languages.

A number of software components are stored in the memory 806 and are executable by the processor 803. In this respect, the term "executable" means a program file that is in a form that can ultimately be run by the processor 803. Examples of executable programs may be, for example, a compiled program that can be translated into machine code in a format that can be loaded into a random access portion of the memory 806 and run by the processor 803, source code that may be expressed in proper format such as object code that is capable of being loaded into a random access portion of the memory 806 and executed by the processor 803, or source code that may be interpreted by another executable program to generate instructions in a random access portion of the memory 806 to be executed by the processor 803, etc. An executable program may be stored in any portion or component of the memory 806 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 806 is defined herein as including both volatile and nonvolatile memory and data storage components. Volatile components are those that do not retain data values upon loss of power. Nonvolatile components are those that retain data upon a loss of power. Thus, the memory 806 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 803 may represent multiple processors 803 and/or multiple processor cores and the memory 806 may represent multiple memories 806 that operate in parallel processing circuits, respectively. In such a case, the local interface 809 may be an appropriate network that facilitates communication between any two of the multiple processors 803, between any processor 803 and any of the memories 806, or between any two of the memories 806, etc. The local interface 809 may comprise additional systems designed to coordinate this communication, including, for example, performing load balancing. The processor 803 may be of electrical or of some other available construction.

Although the encoding application 812, and other various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits (ASICs) having appropriate logic gates, field-programmable gate arrays (FPGAs), or other components, etc. Such technologies are generally well known by those skilled in the art and, consequently, are not described in detail herein.

The flowcharts of FIGS. 6 and 7 show the functionality and operation of an implementation of portions of the encoding application. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 803 in a computer system or other system. The machine code may be converted from the source code, etc. If embodied in hardware, each block may represent a circuit or a number of interconnected circuits to implement the specified logical function(s).

Although the flowcharts of FIGS. 6 and 7 show a specific order of execution, it is understood that the order of execution may differ from that which is depicted. For example, the order of execution of two or more blocks may be scrambled relative to the order shown. Also, two or more blocks shown in succession in FIGS. 6 and 7 may be executed concurrently or with partial concurrence. Further, in some embodiments, one or more of the blocks shown in FIGS. 6 and 7 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including the encoding application 812, that comprises software or code can be embodied in any non-transitory computer-readable medium for use by or in connection with an instruction execution system such as, for example, a processor 803 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

Further, any logic or application described herein, including the encoding application 812, may be implemented and structured in a variety of ways. For example, one or more applications described may be implemented as modules or components of a single application. Further, one or more applications described herein may be executed in shared or separate computing devices or a combination thereof. For example, a plurality of the applications described herein may execute in the same source device 203, or in multiple computing devices in the same computing environment. Additionally, it is understood that terms such as "application," "service," "system," "engine," "module," and so on may be interchangeable and are not intended to be limiting.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A system for in-band network management, comprising:

a first communication device configured to communicate with a second communication device, the first communication device including circuitry configured to:

encode a bit-interleaved parity error code for a monitored portion of network data;

encode network management data in a plurality of bits according to a predefined block code;

generate a transmission frame, an alignment marker of the transmission frame including a first bit-interleaved parity block including the encoded bit-interleaved parity error code and a second bit-interleaved parity block including at least the encoded network management data; and transmit the transmission frame from the first communication device to the second communication device.

2. The system of claim 1, wherein the predefined block code generates the plurality of bits to maintain a DC balance between the bit-interleaved parity error code and the plurality of bits.

3. The system of claim 2, wherein the circuitry of the first communication device is further configured to generate a uniform block including at least the plurality of bits having encoded network management data and a plurality of remaining bits in the second bit-interleaved parity block encoded to maintain DC balance between the bit-interleaved parity error code and the uniform block.

4. The system of claim 1, wherein the plurality of bits include a predefined number of bits that are configurable, by an administrator of the in-band network management.

5. The system of claim 1, wherein the predefined block code is at least one of 3B/4B block code, 4B/5B block code, and 8B/10B block code.

6. The system of claim 1, wherein the first bit-interleaved parity block includes bit-interleaved parity-3.

7. The system of claim 1, wherein the second bit-interleaved parity block includes bit-interleaved parity-7.

8. The system of claim 1, wherein the network management data further includes point-to-point or multi-point management information between the first communication device and the second communication device.

9. The system of claim 1, wherein the first communication device includes a first Ethernet switch and the second communication device includes a second Ethernet switch.

10. The system of claim 1, wherein the first communication device includes an Ethernet switch and the second communication device includes a gearbox PHY.

11. A method for in-band network management, comprising:

encoding, by a first communication device, a bit-interleaved parity error code for a monitored portion of network data;

encoding, by the first communication device, network management information in a plurality of bits according to a predefined block code, the predefined block code generating the plurality of bits to maintain a DC balance between the encoded bit-interleaved parity error code and the plurality of bits;

generating, by the first communication device, a transmission frame, an alignment marker of the transmission frame including a first bit-interleaved parity block including the encoded bit-interleaved parity error code and a second bit-interleaved parity block including the encoded network management information; and transmitting the transmission frame from the first communication device to a second communication device.

12. The method of claim 11, further comprising generating, by the first communication device, a uniform block including at least the plurality of bits having encoded network management data and a plurality of remaining bits in the second bit-interleaved parity block encoded to maintain DC balance between the bit-interleaved parity error code and the uniform block.

13. The method of claim 11, wherein the plurality of bits includes a predefined number of bits that are configurable by an administrator of the in-band network management.

14. The method of claim 11, wherein the predefined block code is at least one of 3B/4B block code, 4B/5B block code, and 8B/10B block code.

15. The method of claim 11, wherein the first bit-interleaved parity block includes bit-interleaved parity-3.

16. The method of claim 11, wherein the second bit-interleaved parity block includes bit-interleaved parity-7.

17. The method of claim 11, wherein the network management information further includes point-to-point or multi-point management information between the first communication device and the second communication device.

18. A non-transitory computer-readable medium encoded with computer-readable instructions thereon that, when executed by a processor in data communication with a first communication device, cause the processor to perform a method comprising:

encoding a bit-interleaved parity error code for a monitored portion of network data in a first bit-interleaved parity block;

encoding network management data in a plurality of bits for transmission in a second bit-interleaved parity block according to a predefined block code, the predefined block code generating the plurality of bits to maintain a DC balance between the bit-interleaved parity error code and the plurality of bits;

generating a transmission frame, an alignment marker of the transmission frame including at least the first bit-interleaved parity block and the second bit-interleaved parity block; and transmitting the transmission frame from the first communication device to a second communication device.

19. The non-transitory computer-readable medium of claim 18, wherein the first bit-interleaved parity block includes bit-interleaved parity-3.

20. The non-transitory computer-readable medium of claim 18, wherein the second bit-interleaved parity block includes bit-interleaved parity-7.

* * * * *